(12) United States Patent
Choi

(10) Patent No.: US 9,577,155 B2
(45) Date of Patent: *Feb. 21, 2017

(54) LIGHT EMITTING DEVICE

(71) Applicant: LG INNOTEK CO., LTD., Seoul (KR)

(72) Inventor: Seok Beom Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/959,266

(22) Filed: Dec. 4, 2015

(65) Prior Publication Data

US 2016/0087156 A1    Mar. 24, 2016

Related U.S. Application Data

(63) Continuation of application No. 14/296,147, filed on Jun. 4, 2014, now Pat. No. 9,224,922.

(30) Foreign Application Priority Data

Jun. 5, 2013    (KR) .......................... 10-2013-0064394

(51) Int. Cl.
| | |
|---|---|
| H01L 29/06 | (2006.01) |
| H01L 31/12 | (2006.01) |
| H01L 31/109 | (2006.01) |
| H01L 21/00 | (2006.01) |
| H01L 33/40 | (2010.01) |
| H01L 33/38 | (2010.01) |
| H01L 33/62 | (2010.01) |
| H01L 33/30 | (2010.01) |
| H01L 33/20 | (2010.01) |

(52) U.S. Cl.
CPC ............. *H01L 33/405* (2013.01); *H01L 33/38* (2013.01); *H01L 33/62* (2013.01); *H01L 33/20* (2013.01); *H01L 33/30* (2013.01); *H01L 2224/16245* (2013.01)

(58) Field of Classification Search
CPC ........ H01L 33/06; H01L 33/405; H01L 33/30; H01L 33/0079; H01L 33/62; H01L 33/54; H01L 2924/01079; H01L 27/1214; H01L 27/156; B82Y 20/00; H01S 5/0262; H01S 5/0264
USPC ...... 438/22, 24–29; 257/13, 79–85, 88, 184, 257/190
See application file for complete search history.

(56) References Cited

U.S. PATENT DOCUMENTS

| | | | |
|---|---|---|---|
| 9,224,922 B2 * | 12/2015 | Choi | ..................... H01L 33/405 |
| 2005/0151150 A1 | 7/2005 | Choi | |
| 2007/0290215 A1 | 12/2007 | Kato et al. | |
| 2010/0307578 A1 | 12/2010 | Sekimoto et al. | |

(Continued)

FOREIGN PATENT DOCUMENTS

| | | |
|---|---|---|
| EP | 2 393 132 A2 | 12/2011 |
| JP | 2007-149881 A | 6/2007 |
| JP | 2008-098249 A | 4/2008 |

OTHER PUBLICATIONS

European Search Report dated Oct. 20, 2014 issued in Application No. 14171078.0.

(Continued)

*Primary Examiner* — Hsien Ming Lee
(74) *Attorney, Agent, or Firm* — KED & Associates LLP

(57) ABSTRACT

A light emitting device includes at least one layer below or above a reflective layer to prevent delamination of the reflective layer from a layer below and/or above the reflective layer.

18 Claims, 8 Drawing Sheets

(56) References Cited

U.S. PATENT DOCUMENTS

2011/0220934 A1    9/2011   Gotoda et al.
2012/0074441 A1    3/2012   Seo et al.
2012/0256813 A1   10/2012   Kostka et al.

OTHER PUBLICATIONS

U.S. Office Action dated Apr. 6, 2015 issued in U.S. Appl. No. 14/296,147.
European Office Action dated Jun. 17, 2016 issued in Application No. 14171078.0.

\* cited by examiner

# LIGHT EMITTING DEVICE

CROSS-REFERENCE TO RELATED APPLICATIONS

This present application is a continuation application of co-pending U.S. patent application Ser. No. 14/296,147 filed on Jun. 4, 2014, which claims priority under 35 U.S.C. §119 to Korean Application No. 10-2013-0064394 filed on Jun. 5, 2013, whose entire disclosures are hereby incorporated by reference.

BACKGROUND

1. Field
The embodiment relates to a light emitting device.
2. Background
The embodiment relates to a light emitting device.
The embodiment relates to a light emitting device package.

Studies for a light emitting device package having a light emitting device have been actively pursued.

A light emitting device, which is made of, for example, a semiconductor material, is a semiconductor light emitting device or a semiconductor light emitting diode to convert electrical energy into light energy.

When comparing with conventional light sources such as a fluorescent lamp, and an incandescent lamp, the semiconductor light emitting device has advantages such as low power consumption, a semi-permanent life span, a rapid response speed, safety, and an eco-friendly property. In this regard, various studies have been performed to replace the conventional light sources with the LEDs.

The light emitting devices or light emitting device packages are increasingly used as light sources for lighting devices, such as various lamps used in indoors and outdoors, liquid crystal displays, electric signboards, and street lamps.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of embodiments, it will be understood that when an element is referred to as being 'on (under) or under (on)' another element, it can be directly on another element or at least one intervening element may also be present. Further, when it is expressed as 'upward (downward) or downward (upward)', it may include the upward direction as well as the downward direction on the basis of one element.

Figure 1:
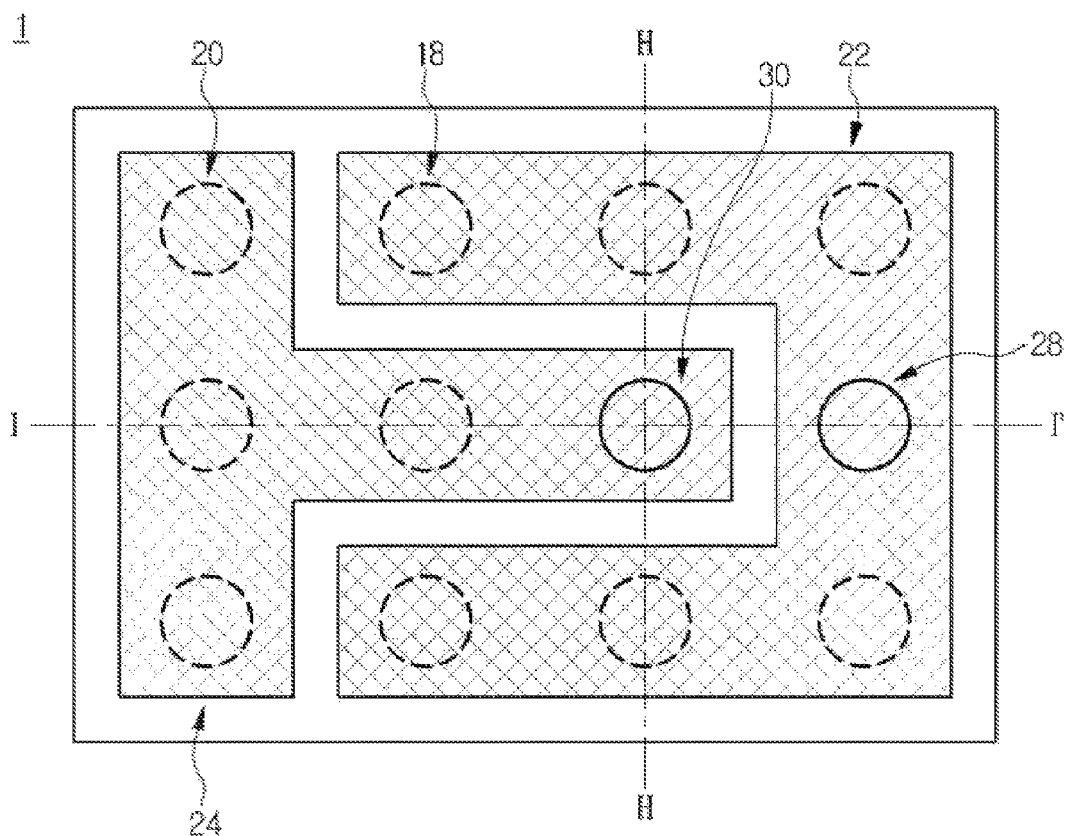
FIG. 1 is a plan view showing a light emitting device according to a first embodiment.
Figure 2:
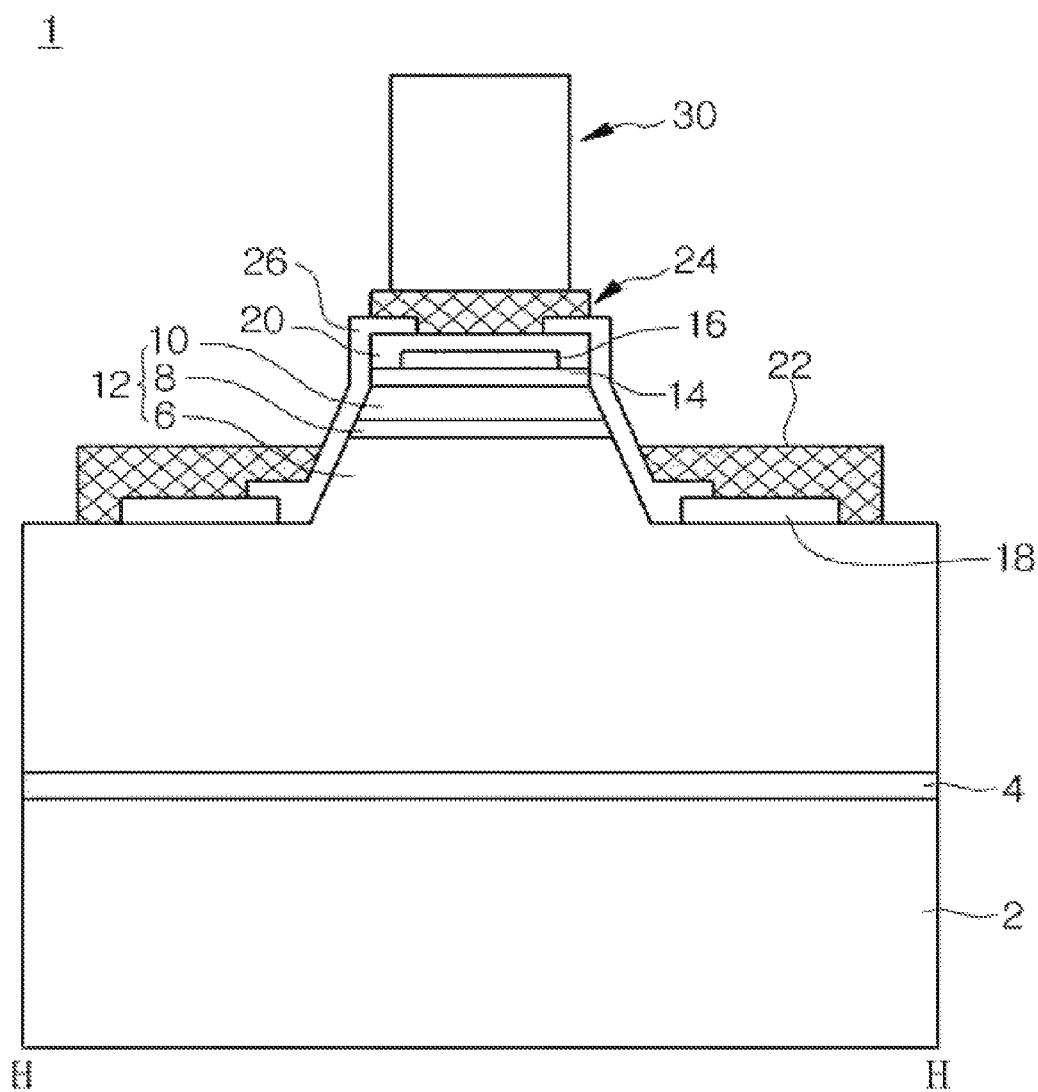
FIG. 2 is a sectional view showing the light emitting device taken along line H-H' of FIG. 1.
Figure 3:
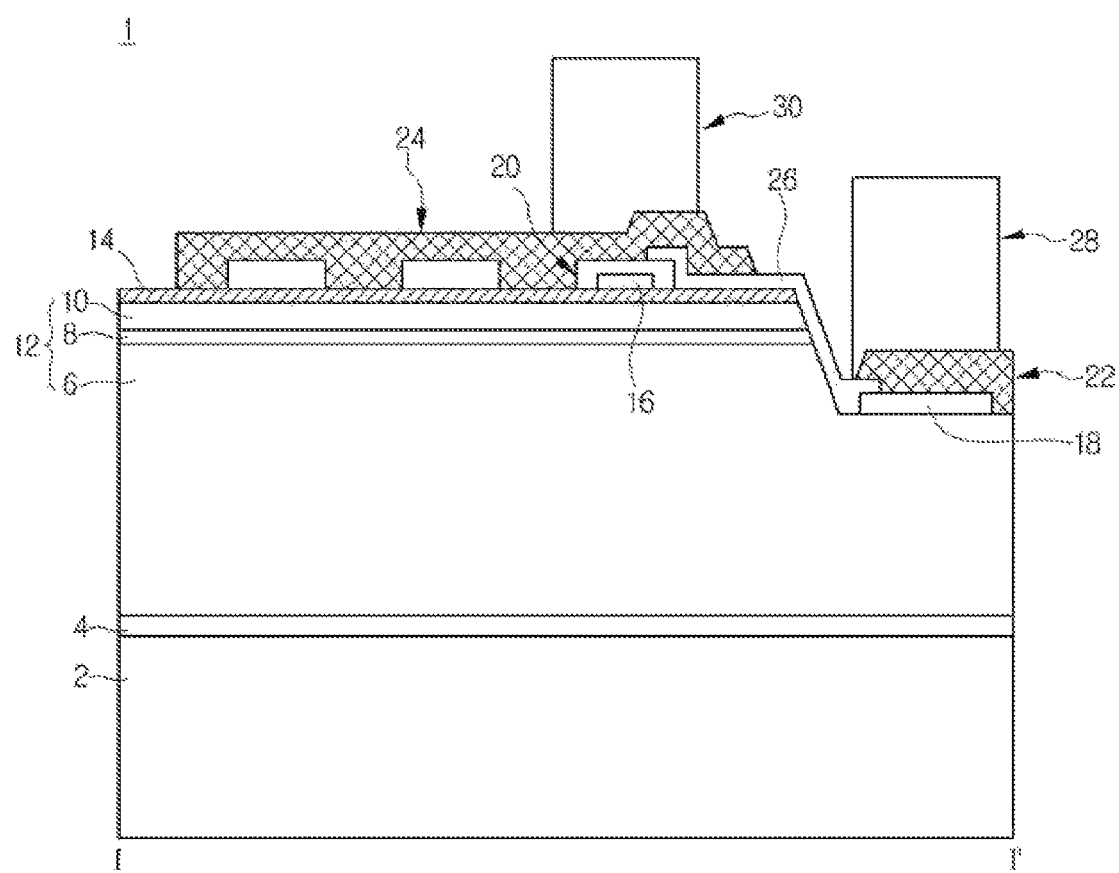
FIG. 3 is a sectional view showing the light emitting device taken along line I-I' of FIG. 1.

FIG. 1 is a plan view showing a light emitting device according to a first embodiment, FIG. 2 is a sectional view showing the light emitting device taken along line H-H' of FIG. 1, and FIG. 3 is a sectional view showing the light emitting device taken along line I-I' of FIG. 1.

Referring to FIGS. 1 to 3, the light emitting device 1 according to the first embodiment may include a growth substrate 2, a light emitting structure 12, a reflective electrode 14, and first and second bumps.

The light emitting device 1 according to the first embodiment may be a flip-chip type light emitting device, but the first embodiment is not limited thereto.

The light emitting device 1 according to the first embodiment may further include a plurality of first electrode pads 18 and a plurality of second electrode pads 20, but the first embodiment is not limited thereto.

The light emitting device 1 according to the first embodiment may further include first and second bump pads 28 and 30, but the first embodiment is not limited thereto.

The light emitting device 1 according to the first embodiment may further include a buffer layer 4, but the first embodiment is not limited thereto.

The light emitting device 1 according to the first embodiment may further include at least one compound semiconductor layer which is disposed on and/or under the light emitting structure 12, but the first embodiment is not limited thereto.

The buffer layer 4 and the light emitting device 12 may be formed of a group II-VI compound semiconductor material or a group III-V compound semiconductor material. For example, the buffer layer 4 and the light emitting structure 12 may include at least one selected from the group consisting of InAlGaN, GaN, AlGaN, InGaN, AlN, InN, and AlInN, but the embodiment is not limited thereto.

The growth substrate 2 is used to grow the light emitting structure 12 while supporting the light emitting structure 12. The growth substrate 2 may include a material suitable to grow a semiconductor material. The growth substrate 2 may include a material having thermal stability and a lattice constant approximate to that of the light emitting structure 12. The growth substrate 2 may be one of a conductive substrate, a compound semiconductor substrate and an insulating substrate, but the embodiment is not limited thereto.

The growth substrate 2 may include at least one selected from the group consisting of Sapphire ($Al_2O_3$), SiC, Si, GaAs, GaN, ZnO, GaP, InP and Ge.

The growth substrate 2 may include dopants such that the growth substrate 2 has conductivity, but the embodiment is not limited thereto. The growth substrate 2 including the dopants may serve as an electrode layer, but the embodiment is not limited thereto.

The buffer layer 4 may be interposed between the growth substrate 2 and the light emitting structure 12, but the embodiment is not limited thereto.

The buffer layer 4 may reduce the difference between the lattice constants of the growth substrate 2 and the light emitting structure 12. In addition, the buffer layer 4 may prevent the material of the growth substrate 2 from being diffused into the light emitting structure 12, prevent a melt-back phenomenon such as a recess formed in the top surface of the growth substrate 2, or prevent the growth substrate 2 from being broken by controlling strain, but the embodiment is not limited thereto.

The buffer layer 4 may be formed on the growth substrate 2 and the light emitting structure 12 may be formed on the buffer layer 4. That is, the buffer layer 4 may be formed between the growth substrate 2 and the light emitting structure 12.

The light emitting structure 12 may be formed on the buffer layer 4. Since the light emitting structure 12 is grown on the buffer layer 4 having a lattice constant similar to a lattice constant of the light emitting structure 12, the defect, such as a dislocation, may be reduced.

The light emitting structure 12 may include a plurality of compound semiconductor layers.

For example, the light emitting structure 12 may include at least a first conductive semiconductor layer 6, an active layer 8, and a second conductive semiconductor layer 10, but the embodiment is not limited thereto.

The active layer 8 may be disposed on the first conductive semiconductor layer 6, and the second conductive semiconductor layer 10 may be disposed on the active layer 8.

The first conductive semiconductor layer 6, the active layer 8, and the second conductive semiconductor layer 10 may be realized by using a group II-VI or III-V compound semiconductor material having a composition formula of $Al_xIn_yGa_{(1-x-y)}N$ ($0 \leq x \leq 1$, $0 \leq y \leq 1$, and $0 \leq x+y \leq 1$). For example, The first conductive semiconductor layer 6, the active layer 8, and the second conductive semiconductor layer 10 may include at least one selected from the group consisting of InAlGaN, GaN, AlGaN, InGaN, AlN, InN and AlInN, but the embodiment is not limited thereto.

For example, the first conductive semiconductor layer 6 may be an N-type semiconductor layer including N-type dopant, and the second conductive semiconductor layer 10 may be a P-type semiconductor layer including P-type dopants, but the embodiment is not limited thereto. The N-type dopants include Si, Ge, and Sn, and the P-type dopants include Mg, Zn, Ca, Sr, and Ba, but the embodiment is not limited thereto.

The active layer 8 emits light having a wavelength corresponding to an energy band gap between the materials constituting the active layer 8 by combining the first carrier, for example, electrons injected through the first conductive semiconductor layer 6 with the second carrier, for example, holes injected through the second conductive semiconductor layer 10.

The active layer 8 may include one of an MQW (multiple quantum well) structure, a quantum wire structure or a quantum dot structure. The active layer 8 may have well layers and barrier layers repeatedly formed at one cycle of a well layer and a barrier layer. The repetition cycle of a well layer and a barrier layer may be varied depending on the characteristics of the light emitting device, but the embodiment is not limited thereto.

For example, the active layer 8 may be formed in the stack structure of InGaN/GaN, InGaN/AlGaN, InGaN/InGaN. The energy bandgap of the barrier layer may be greater than energy the bandgap of the well layer.

Although not shown, a third conductive semiconductor layer may be disposed under the first conductive semiconductor layer 6 and/or on the second conductive semiconductor layer 10. For example, the third conductive semiconductor layer disposed under the first conductive semiconductor layer 6 may include the same conductive dopant as that of the second conductive semiconductor layer 10, but the embodiment is not limited thereto. For example, the third conductive semiconductor layer disposed on the second conductive semiconductor layer 10 may include the same conductive dopant as that of the first conductive semiconductor layer 6, but the embodiment is not limited thereto.

The reflective electrode 14 may be formed on the light emitting structure 12. In detail, the reflective electrode 14 may be formed on the second conductive semiconductor layer 10.

The reflective electrode 14 may have a 'T' shape viewed from the top, but the embodiment is not limited thereto.

The reflective electrode 14 may include a material having a reflective property and superior electric conductivity. For example, the reflective electrode 14 may include one selected from the group consisting of Ag, Ni, Al, Rh, Pd, Ir, Ru, Mg, Zn, Pt, Au, and Hf or the multilayered structure thereof.

The reflective layer 14 may include Ag/Ni/Ti/TiW/Ti or a lamination thereof, but the embodiment is not limited thereto. The Ag has a reflective function, The Ni has a junction function or a diffusion prevention function, the Ti has a junction function, and the TiW has the diffusion prevention function, but the embodiment is not limited thereto.

The reflective electrode 14 may make contact with a top surface of the second, but the embodiment is not limited thereto.

When the reflective electrode 14 does not make ohmic contact with the second conductive semiconductor layer 10, a transparent electrode layer representing a superior ohmic contact characteristic with the second conductive semiconductor layer 10 may be interposed between the reflective electrode 14 and the second conductive semiconductor layer 10, but the embodiment is not limited thereto.

The transparent electrode layer may include a conductive material having superior light transmittance. For example, the transparent electrode may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO or the multilayered structure thereof, but the embodiment is not limited thereto.

A first electrode pad 18 may be formed on the first conductive semiconductor layer 6, and a second electrode pad 20 may be formed on the reflective electrode 14, but the embodiment is not limited thereto.

Each of the first and second electrode pads 18 and 20 may include a circular pattern, but the embodiment is not limited thereto.

The first and second electrode pads 18 and 20 may include a material having superior electric conductivity. The first and second electrode pads 18 and 20 may include one selected from the group consisting of Al, Ti, Cr, Ni, Pt, Au, W, Cu, and Mo, or the multilayered structure thereof, but the embodiment is not limited thereto.

For example, the first and second electrode pads 18 and 20 may include Cr/Ni/Ti/TiW/Ti or a lamination thereof, but the embodiment is not limited thereto. The Cr has an electrode function, The Ni has a junction function or a diffusion prevention function, the Ti has a junction function, and the TiW has the diffusion prevention function, but the embodiment is not limited thereto.

A first bump pad 22 may be formed on the first electrode pad 18, and a second bump pad 24 may be formed on the second electrode pad 20, but the embodiment is not limited thereto.

The first and second bump pads 22 and 24 may allow the first bump 28 and the second bump 30 to be easily bonded, and may stably support the first and second bumps 28 and 30, but the embodiment is not limited thereto.

When viewed from the top, the first bump pad 22 may have a 'B' shape, and the second bump pad 24 may have a 'T' shape, but the embodiment is not limited thereto. The second bump pad 24 may vertically overlap with the entire region of the reflective electrode 14, but the embodiment is not limited thereto. When viewed from the top, the first bump pad 22 may surround one side region of the second bump pad 24, but the embodiment is not limited thereto.

Similar to the first and second electrode pads 18 and 20, the first and second bump pads 22 and 24 may include a material having superior electric conductivity. The first and second bump pads 22 and 24 may include one selected from the group consisting of Al, Ti, Cr, Ni, Pt, Au, W, Cu, and Mo, or the multilayered structure thereof, but the embodiment is not limited thereto.

The first bump pad 22 may vertically overlap with the first electrode pads 18. The second bump pad 24 may vertically overlap with the second electrode pads 20.

The first and second electrode pads 18 and 20 and/or the first and second bump pads 22 and 24 are not essential elements. When the first and second electrode pads 18 and 20 and/or the first and second bump pads 22 and 24 are omitted, the first and second bumps 28 and 30 may be directly formed on the first conductive semiconductor layer 6 and the reflective electrode 14, respectively. That is, the first bump 28 may make contact with a top surface of the first conductive semiconductor layer 6, and the second bump 30 may make contact with a top surface of the reflective electrode 14, but the embodiment is not The first and second bumps 28 and 30 are used to electrically connect the light emitting device 1 according to the first embodiment to first and second electrode layers disposed at a light emitting device package while supporting the light emitting device 1 according to the first embodiment, but the embodiment is not limited thereto.

Similar to the first and second electrode pads 18 and 20 and/or the first and second bump pads 22 and 24, the first and second bumps 28 and 30 may include a material having superior electric conductivity. The first and second bump pads 22 and 24 may include one selected from the group consisting of Al, Ti, Cr, Ni, Pt, Au, W, Cu, and Mo, or the multilayered structure thereof, but the embodiment is not limited thereto.

Each of the first and second bumps 28 and 30 may have a cylindrical structure, but the embodiment is not limited thereto. That is, the first and second bumps 28 and 30 may have a spherical sectional structure, but the embodiment is not limited thereto.

The light emitting device 1 may further include a protective layer 26. The protective layer 26 may be formed along the circumference of the light emitting structure 12, but the embodiment is not limited thereto.

The protective layer 26 may be formed on a partial region of the first electrode pad 18 and a partial region of the second electrode pad 20 as well as the circumference of the light emitting structure 12.

The protective layer 26 may include an opening 27 on the second electrode pad 20, but the embodiment is not limited thereto. That is, the protective layer 26 may be formed on the entire area of the second electrode pad 20 except for the opening 27.

The protective layer 26 may include a material of a superior insulation characteristic. The protective layer 26 may include one selected from the group consisting of $SiO_2$, $SiO_x$, $SiO_xN_y$, $Si_3N_4$, and $Al_2O_3$, or the multilayered structure thereof, but the embodiment is not limited thereto.

The protective layer 26 may prevent a short circuit from being formed between the first electrode pad 18 disposed on the first conductive semiconductor layer 6 and the reflective electrode 14 and/or the second electrode pad 20 disposed on the first conductive semiconductor layer 6, and may prevent a short circuit from being formed between the first electrode pad 18 or the reflective electrode 14 and/or the second electrode pad 20 and the active layer 8.

Meanwhile, when the growth substrate 2 is directed upward in the flip-chip type light emitting device, the reflective electrode 14 reflects light, which is generated from the active layer and traveled downward, in the upward direction. Accordingly, the light extraction efficiency is increased so that the optical characteristic can be improved.

However, the reflective electrode 14 represents inferior bonding characteristic with respect to other adjacent layers, for example, the second conductive semiconductor layer 10 and/or the second electrode pad 20. That is, when external shock or stress is applied to the reflective electrode 14, the reflective electrode 14 may be delaminated from the adjacent layer.

When the light emitting device 1 according to the first embodiment is mounted on a body of a light emitting device package, the first and second bumps 28 and 30 of the light emitting device 1 are melted by heat having a high temperature and then cooled, so that the light emitting device 1 may be attached to first and second electrode layers disposed on the body. When the first and second bumps 28 and 30 are cooled after being melted, stress such as compressive force is caused at the first and second bumps 28 and 30. The stress exerts influence upon the reflective electrode 14 through the second bump pad 24 and the second electrode pad 20. Accordingly, the reflective electrode 14 is delaminated from the second conductive semiconductor layer 10 or the second electrode pad 20 due to the stress caused by the second bump 30.

According to the first embodiment, a delamination prevention layer 16 may be formed between the reflective electrode 14 and the second electrode pad 20. That is, the delamination prevention layer 16 may make contact with a top surface of the reflective electrode 14 and may make contact with a bottom surface of the second electrode pad 20.

When the second electrode pad 20 is not formed, the delamination prevention layer 16 may make contact with a bottom surface of the second bump pad 24, but the embodiment is not limited thereto.

When the second electrode pad 20 and the second bump pad 24 are not formed, the delamination prevention layer 16 may make contact with the bottom surface of the second bump 30, but the embodiment is not limited thereto.

The delamination prevention layer 16 may absorb the stress caused by the second bump 30 so that the stress may not be further applied to the reflective electrode 14 anymore.

Further, the delamination prevention layer 16 may represent superior adhesion force with the reflective electrode 14 so the delamination prevention layer 16 may prevent the reflective electrode 14 from being delaminated.

Although the first embodiment has been described that the delamination prevention layer 16 is formed on the reflective electrode 14, another delamination prevention layer 16 may be formed under the reflective electrode 14. That is, another delamination prevention layer 16 may be formed between the second conductive semiconductor layer 10 and the reflective electrode 14, but the embodiment is not limited thereto. In this case, even when the stress from the second bump 30 is applied to the reflective electrode 14, the reflective electrode 14 may be prevent from being delaminated by another delamination prevention layer 16.

The delamination prevention layer 16 may include an inorganic insulation material, but the embodiment is not limited thereto. Like the protective layer 26, the delamination prevention layer 16 may include a material of a superior insulation characteristic. The delamination prevention layer 16 may include one selected from the group consisting of $SiO_2$, $SiO_x$, $SiO_xN_y$, $Si_3N_4$, and $Al_2O_3$, or the multilayered structure thereof, but the embodiment is not limited thereto.

Although the delamination prevention layer 16 is formed, since the reflective electrode 14 is electrically connected to the second electrode pad 20, the second electrode pad 20 may make contact with a top surface of the reflective electrode 14 while interposing the delamination prevention layer 16, but the embodiment is not limited thereto.

For example, the second electrode pad 20 may surround the delamination prevention layer 16. That is, the second electrode pad 20 may include a first region formed on the delamination prevention layer 16 and a second region extending downward from an edge of the first region on a side of the delamination prevention layer 16. The second region of the second electrode pad 20 may make contact with a top surface of the reflective electrode 14.

Figure 4:
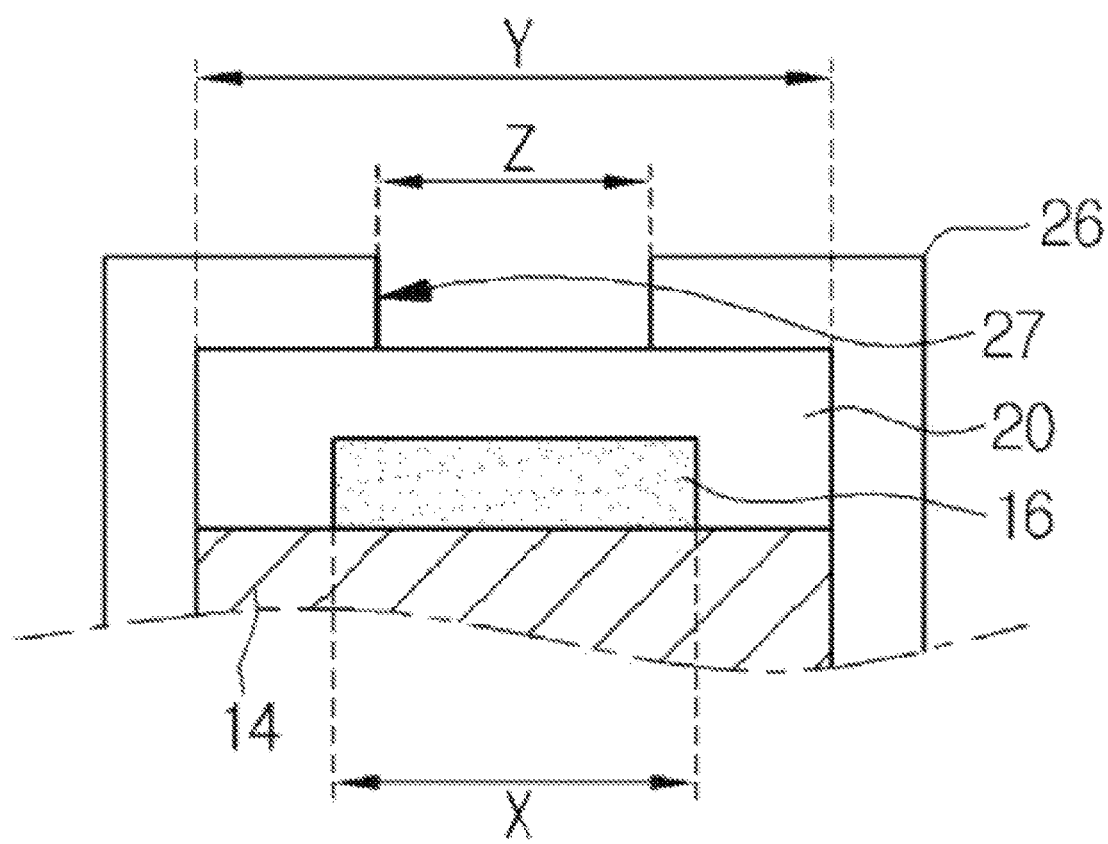
FIG. 4 is a view illustrating the relationship between a width of the delamination prevention layer and a width of a circumference thereof shown in FIG. 1.

As shown in FIG. 4, a width of the delamination prevention layer 16 is X, a width of the second electrode pad 20 is Y, and a diameter of an opening 27 of the protective layer 26 is Z. In this case, the relationship among the width X of the delamination prevention layer 16, the width Y of the second electrode pad 20, and the diameter Z of an opening 27 of the protective layer 26 may be expressed by a following equation 1.

$$Z < X < Y$$ [Equation 1]

X: 1
Y: 2 or greater
Z: 0.5~1.0

The diameter Z of an opening 27 of the protective layer 26 may be at least 50% based on the width X of the delamination prevention layer 16. When the diameter Z of an opening 27 of the protective layer 26 less than the 50% of the width X of the delamination prevention layer 16, since the diameter Z of an opening 27 of the protective layer 26 is very small, a contact area between the second electrode pad 20 and the second bump pad 24 is reduced so that power may not be easily supplied.

The width Y of the second electrode pad 20 is at least twice greater than the width X of the delamination prevention layer 16. When the width Y of the second electrode pad 20 is not twice greater than the width X of the delamination prevention layer 16, a width of the second region of the second electrode pad 20 is reduced. If the width of the second region of the second electrode pad 20 is reduced, a contact area between the second electrode pad 20 and the reflective electrode 14 is reduced so that power may not be easily supplied.

Figure 5:
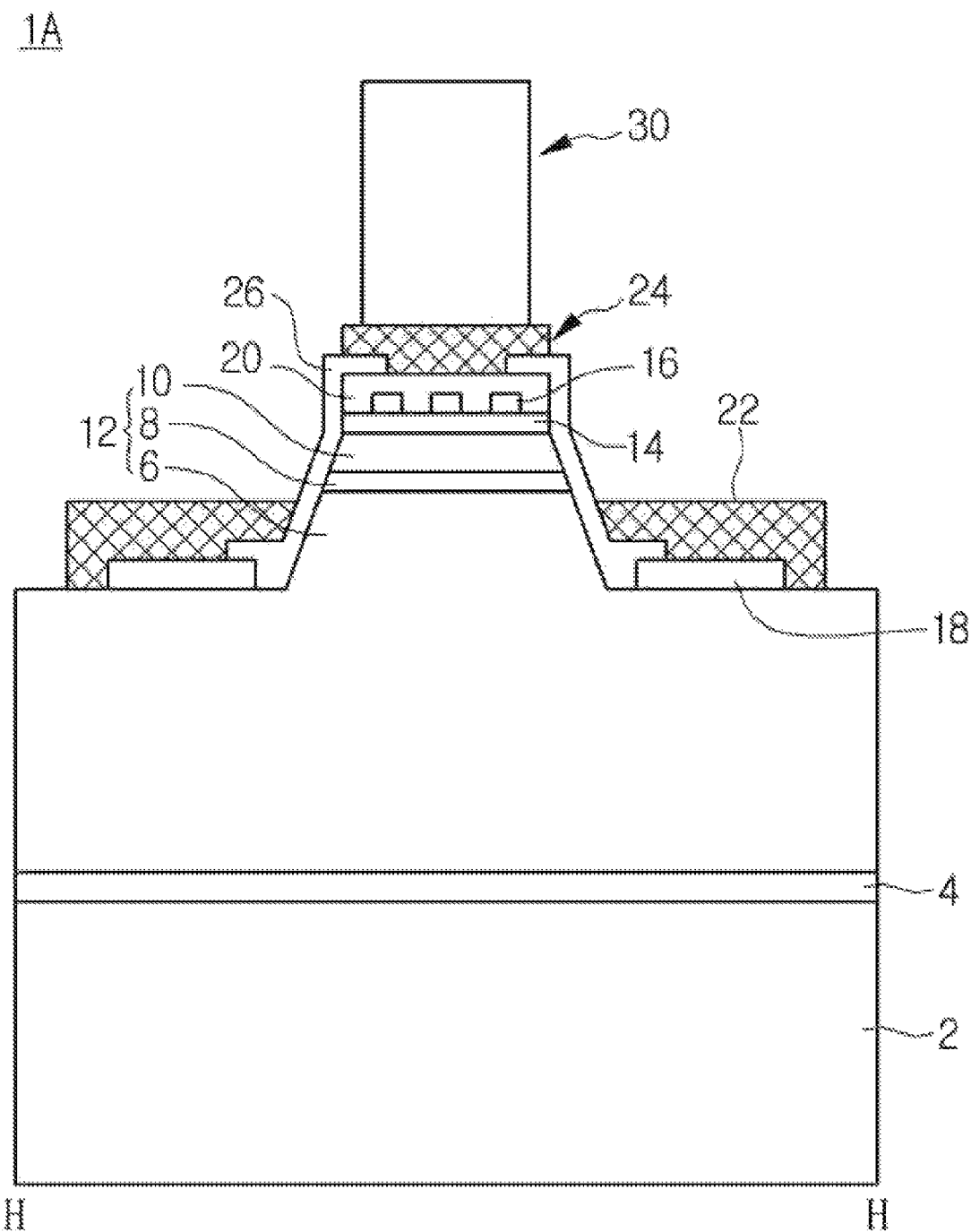
FIG. 5 is a sectional view showing a light emitting device according to a second embodiment.

FIG. 5 is a sectional view showing a light emitting device according to a second embodiment.

The second embodiment is substantially similar to the first embodiment except that the delamination prevention layer 16 is formed therein with a plurality of holes 32. In the following description of the second embodiment, the constituent elements having the same function and structure as those of the first embodiment will be assigned with the same reference numerals and a detailed description thereof will be omitted.

Referring to FIG. 5, the light emitting device 1A according to the second embodiment may include a growth substrate 2, a light emitting structure 12, a reflective electrode 14, and first and second bumps 28 and 30.

The light emitting device 1A according to the second embodiment may further include at least one of a plurality of first electrode pads 18 and a plurality of second electrode pads 20, and first and second bump pads 22 and 24, but the second embodiment is not limited thereto.

The light emitting device 1A according to the second embodiment may further include at least one compound semiconductor layer which is disposed on and/or under the light emitting structure 12, but the second embodiment is not limited thereto.

According to the second embodiment, a delamination prevention layer 16 may be formed between the reflective electrode 14 and the second electrode pad 20. That is, the delamination prevention layer 16 may make contact with a top surface of the reflective electrode 14 and may make contact with a bottom surface of the second electrode pad 20.

Figure 6:
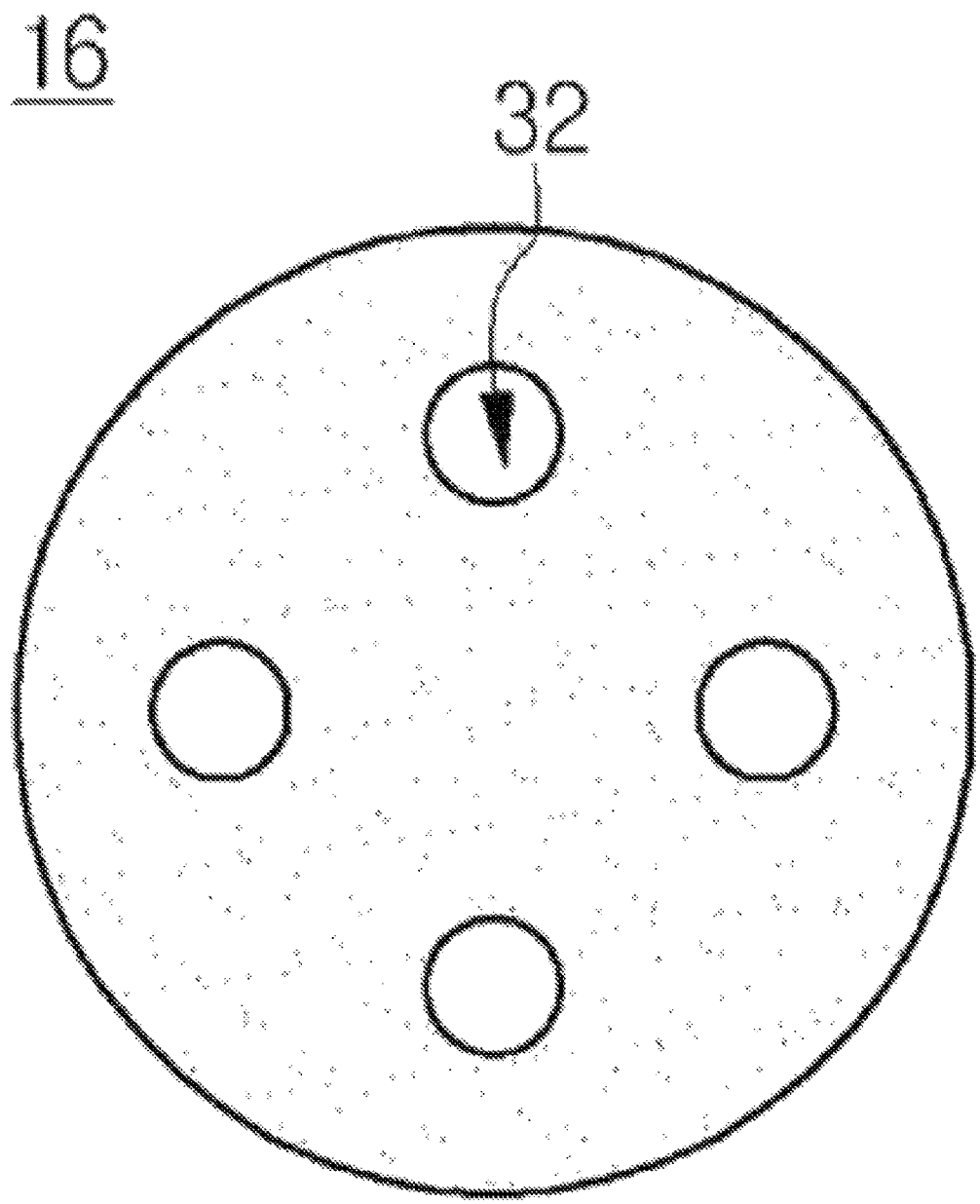
FIG. 6 is a plan view showing the delamination prevention layer of FIG. 5.

As shown in FIG. 6, the delamination prevention layer 16 may include a plurality of holes 32. The holes 32 may be randomly or constantly formed.

The second electrode pad 20 may make contact with the reflective electrode 14 through the holes 32 of the delamination prevention layer 16.

Further, the second electrode pad 20 may surround an outer side of the delamination prevention layer 16 to make contact with a top surface of the reflective electrode 14, but the embodiment is not limited thereto.

The second electrode pad 20 may make contact with the reflective electrode 14 through the circumference of the delamination prevention layer 16.

Although not shown, when a plurality of holes 32 are formed at the delamination prevention layer 16 so that a contact area between the second electrode pad 20 and the reflective electrode 14 is ensured through the holes 32 to easily supply power, a diameter of the delamination prevention layer 16 may be the same as a width of the reflective electrode 14 and/or a width of the second electrode 20. In this case, a side of the delamination prevention layer 16 may make contact with an inner side of the protective layer 26, but the embodiment is not limited thereto.

Figure 7:
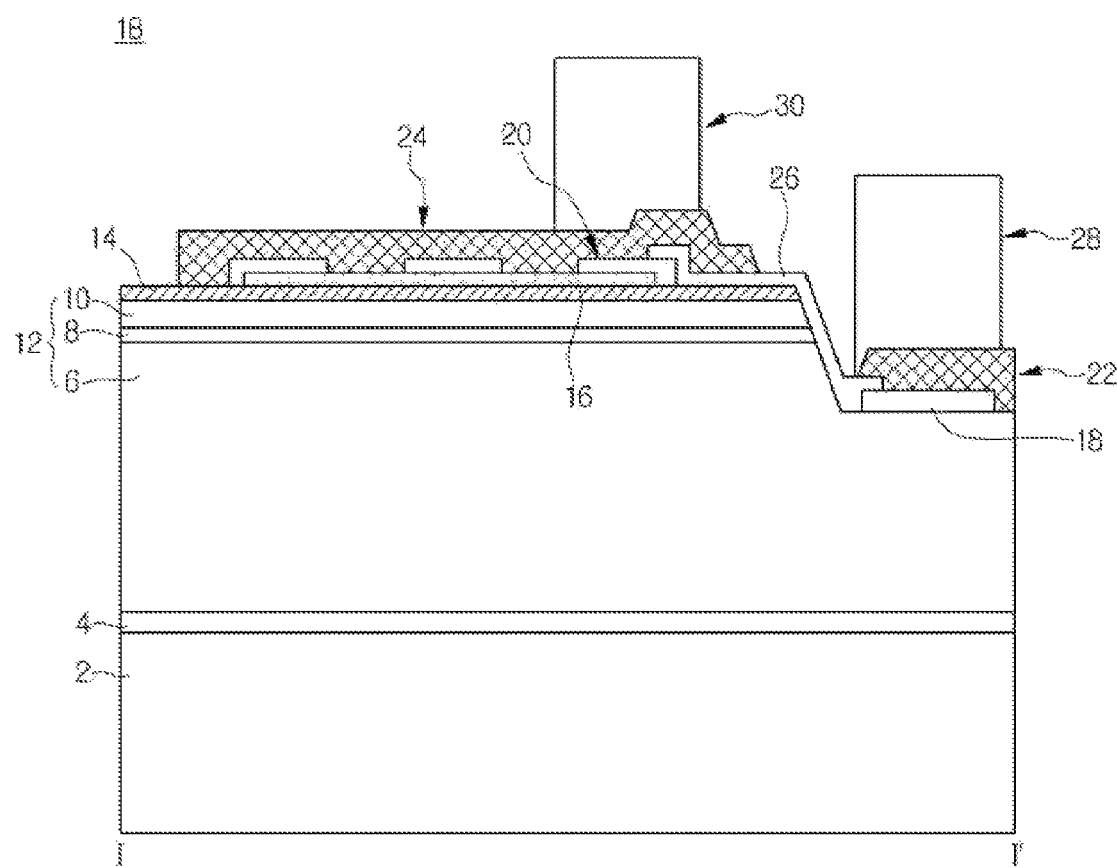
FIG. 7 is a sectional view showing a light emitting device according to a third embodiment.

FIG. 7 is a sectional view showing a light emitting device according to a third embodiment.

The third embodiment is substantially similar to the first embodiment except that the delamination prevention layer 16 is formed at other regions except for under the second bump 30.

In the following description of the third embodiment, the constituent elements having the same function and structure as those of the first embodiment will be assigned with the same reference numerals and a detailed description thereof will be omitted.

Referring to FIG. 7, the light emitting device 1B according to the third embodiment may include a growth substrate 2, a light emitting structure 12, a reflective electrode 14, and first and second bumps 28 and 30.

The light emitting device 1B according to the third embodiment may further include at least one of a plurality of first electrode pads 18 and a plurality of second electrode pads 20, and first and second bumps 28 and 30, but the second embodiment is not limited thereto.

The light emitting device 1A according to the third embodiment may further include at least one compound semiconductor layer which is disposed on and/or under the light emitting structure 12, but the third embodiment is not limited thereto.

According to the third embodiment, a delamination prevention layer 16 may be formed between the reflective electrode 14 and the second electrode pad 20. That is, the delamination prevention layer 16 may make contact with a top surface of the reflective electrode 14 and may make contact with a bottom surface of the second electrode pad 20.

Further, the delamination prevention layer 16 may be formed not only under the second bump 30, but also on various regions other than the second bump 30.

The delamination prevention layer 16 may be formed along the reflective electrode 14 having a 'T' shape, but the embodiment is not limited thereto. The second electrodes 20 may be formed on the delamination prevention layer 16.

The second bump pad 24 may cover the delamination prevention layer 16. The bump pad 24 may be formed on a top surface and a side of the delamination prevention layer 16, and may make contact with a top surface of the reflective electrode 14.

Although not described in the first to third embodiments, the second bump 30 may be formed at regions in which the second electrode pad 20 is not formed. That is, the second bump 30 may be formed on the reflective electrode 40 between the second electrode pads 20. In a case of this structure, the delamination prevention layer 16 according to the first to third embodiments may not be formed under the second bump 30.

Although not shown, the first electrode pads 18 and/or second electrode pads may be electrically insulated from each other through the protective layer 26, and top surface of the first and second electrode pads 18 and 20 may be electrically connected to the first and second bump pads 22 and 24, but the embodiment is not limited thereto.

Figure 8:
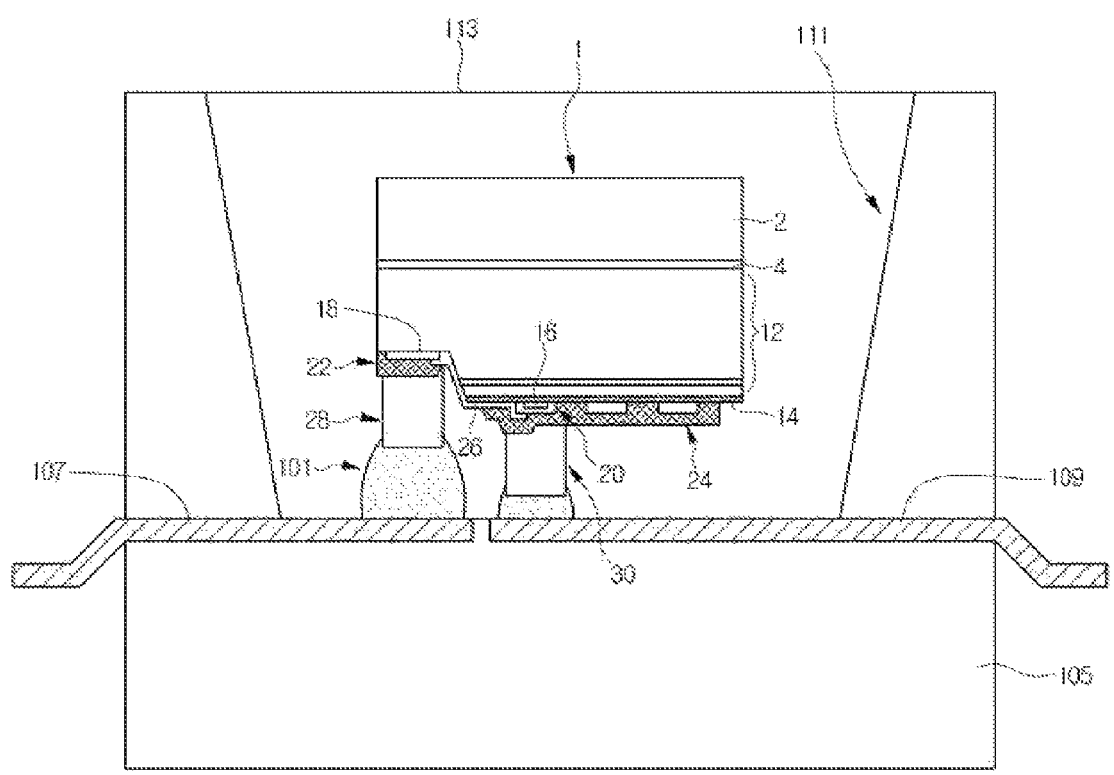
FIG. 8 is a sectional view showing a light emitting device package according to an embodiment.

FIG. 8 is a sectional view showing a light emitting device package according to an embodiment.

Referring to FIG. 8, the light emitting device package may include a light emitting device 1 to generate light and a body 105 on which the light emitting device 1 is mounted.

The light emitting device 1 may include flip-chip type light emitting devices according to the first to third embodiments, but the embodiment is not limited thereto.

The body 105 may be formed in an upper region thereof with a cavity 111 having an inclined surface and recessed downward, but the embodiment is not limited thereto. In other words, the cavity 111 may include the inclined surface and a flat bottom surface, but the embodiment is not limited thereto. An inner side of the cavity 111 may have a vertical surface vertical to the bottom surface, but the embodiment is not limited thereto.

The first and second electrode layers 107 and 109 may be formed through the body 105. The first electrode layer 107 may be electrically insulated and spaced apart from the second electrode layer.

The first and second electrode layers 107 and 109 may be formed on a lateral side of the body 105 while being horizontally formed through the body 105. Although not shown, the first and second electrode layers 107 and 109 may be formed on a bottom surface of the body 105 while being vertically formed through the body 105.

The first and second electrode layers 107 and 109 may be formed on a bottom surface of the cavity 111.

The first and second electrode layers 107 and 109 may include a metallic material, such as copper (Cu), aluminum (Al), chrome (Cr), platinum (Pt), nickel (Ni), titanium (Ti), gold (Au), or W (tungsten), representing superior electric conductivity and superior corrosion resistance, but the embodiment is not limited thereto.

A material constituting the body 105 is injected through an injection molding process in the state that the first and second electrodes layers 107 and 109 are provided, and hardened to form the body 105, so that the first and second electrode layers 107 and 109 may fix the body 105, but the embodiment is not limited thereto.

The first and second electrode layers 107 and 109 may include a single layer or a multi-layer, but the embodiment is not limited thereto. The uppermost layer in the first and second electrode layers 107 and 109 may include a protective layer such Ag, but the embodiment is not limited thereto.

The first and second bumps 28 and 30 of the light emitting device 1 may be physically fixed to and electrically connected with the first and second electrodes 107 and 109 through a solder paste 101, respectively.

To this end, the first and second bumps 28 and 30 are melted by heat having a high temperature and then cooled. The stress is caused by compressive force due to cooling of the first and second bumps 28 and 30, and the stress may delaminate the reflective electrode 14 of the light emitting device.

In order to prevent such a delamination, a delamination prevention layer 16 may be formed between the reflective electrode 14 and the second electrode pad 20. Since the stress generated from the second bump 30 is absorbed by the delamination prevention layer 16, the reflective electrode 14 may be prevented from being delaminated.

The molding member 113 may surround the light emitting device 1. The molding member 113 may be formed in the cavity 111. That is, the molding member 113 may be filled in the cavity 111.

The molding member 113 may contain a phosphor to convert the wavelength of light, but the embodiment is not limited thereto.

The top surface of the molding member 30 may be aligned line with the top surface of the body 105, or may be higher than or lower than the top surface of the body 105, but the embodiment is not limited thereto.

The molding member 113 may include a material representing a transmission characteristic, a heat radiation characteristic, and/or an insulating characteristic. For example, the molding member 113 may include a silicon material or an epoxy material, but the embodiment is not limited thereto.

Although not shown, the light emitting device according to the first to third embodiments is applicable to a COB (chip on board) light emitting device package, but the embodiment is not limited thereto. A plurality of light emitting devices may be mounted on a sub-mount in the COB light emitting device package, but the embodiment is not limited thereto.

The light emitting device and the light emitting device package according to the embodiment are applicable to a light unit. The light unit is applicable to a display device and a lighting device, for example, a lighting lamp, a signal lamp, a headlight of a vehicle, an electric signboard, and an indication lamp.

The embodiment provides a light emitting device capable of improving reliability of a device.

The embodiment provides a light emitting device capable of preventing an electrode from being delaminated.

The embodiment provides a light emitting device capable of improving light efficiency.

According to the embodiment, there is provided a light emitting device including: a substrate; a light emitting structure on the substrate and including a first conductive semiconductor layer, an active layer, and a second conductive semiconductor layer; a reflective electrode on the second conductive semiconductor layer; a first bump on the reflective electrode; and a first delamination prevention layer between the reflective electrode and the first bump.

According to the embodiment, there is provided a light emitting device package including: a body having a cavity; first and second electrode layers in the cavity; a light emitting device on the first and second electrode layers; and a molding member to surround the light emitting device.

According to the embodiment, since the delamination prevention layer is formed between the reflective electrode and an electrode pad so that the reflective electrode is prevented from being delaminated by the delamination prevention layer, the reliability can be improved.

According to the embodiment, since the electrode pad is electrically connected to an outer side of the delamination prevention layer or is electrically connected to the reflective electrode by passing through the delamination prevention layer, even if the delamination prevention layer is formed, power may be easily supplied.

According to the embodiment, since the bump is electrically connected to a plurality of electrode pads, current may be rapidly supplied to the entire region of the light emitting device, so that the light efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a light emitting structure on the substrate and including a first conductive semiconductor layer, an active layer, and a second conductive semiconductor layer;
   a reflective electrode on the second conductive semiconductor layer;
   a second bump over the reflective electrode;
   a prevention layer provided between the reflective electrode and the second bump;
   a second electrode pad that contacts with the reflective electrode through a lateral side of the prevention layer;
   a second bump pad provided between the prevention layer and the second bump; and
   a protective layer provided on an edge region between the second electrode pad and the second bump pad.

2. The light emitting device of claim 1, further comprising:
   a first bump on the first conductive semiconductor layer; and
   at least one of a first electrode pad and a first bump pad provided between the first conductive semiconductor layer and the first bump.

3. The light emitting device of claim 2, wherein the first bump pad surrounds a lateral region of the second bump pad.

4. The light emitting device of claim 1, wherein the protective layer is provided along a circumference of the light emitting structure, and wherein the protective layer includes an opening on the second electrode pad.

5. The light emitting device of claim 4, wherein a diameter of the opening of the protective layer is at least 50% of a width of the prevention layer.

6. The light emitting device of claim 1, wherein the second electrode pad and the second bump pad are provided between the prevention layer and the second bump.

7. The light emitting device of claim 1, wherein the second electrode pad covers the prevention layer.

8. The light emitting device of claim 1, wherein the prevention layer makes contact with a top surface of the reflective electrode, and wherein the prevention layer includes an insulation material.

9. A light emitting device comprising:
   a substrate;
   a light emitting structure on the substrate and including a first conductive semiconductor layer, an active layer, and a second conductive semiconductor layer;
   a reflective electrode on the second conductive semiconductor layer;
   a second bump over the reflective electrode;
   a prevention layer provided between the reflective electrode and the second bump, the prevention layer having a plurality of holes;
   a second electrode pad that contacts with the reflective electrode through a circumference of the prevention layer;
   a second bump pad provided between the prevention layer and the second bump; and
   a protective layer provided on an edge region between the second electrode pad and the second bump pad.

10. The light emitting device of claim 9, further comprising a second electrode pad provided between the prevention layer and the second bump, wherein the second electrode pad makes contact with the reflective electrode through the holes.

11. The light emitting device of claim 10, wherein the prevention layer prevents a delamination of the reflective electrode.

12. The light emitting device of claim 10, wherein the reflective electrode includes one selected from the group consisting of Ag, Ni, Al, Rh, Pd, Ir, Ru, Mg, Zn, Pt, Au, and Hf.

13. A light emitting device comprising:
    a substrate;
    a light emitting structure on the substrate and including a first conductive semiconductor layer, an active layer, and a second conductive semiconductor layer;

a reflective electrode on the second conductive semiconductor layer;

a second bump over the reflective electrode;

a prevention layer provided between the reflective electrode and the second bump;

a plurality of electrode pads on the prevention layer;

a second electrode pad in contact with the reflective electrode through a lateral side of the prevention layer; and a second bump pad provided between the prevention layer and the second bump, wherein the prevention layer is formed to correspond to the second bump pad on the reflective electrode.

14. The light emitting device of claim 13, wherein the reflective electrode includes a stack structure of Ag/Ni/Ti/TiW/Ti.

15. The light emitting device of claim 13, further comprising a protective layer provided on an edge region between the second electrode pad and the second bump pad.

16. The light emitting device of claim 15, wherein the protective layer is provided along a circumference of the light emitting structure, and wherein the protective layer includes an opening on the second electrode pad.

17. The light emitting device of claim 13, further comprising the second electrode pad provided between the prevention layer and the second bump, and the second bump pad formed on a top surface and a lateral side of the prevention layer.

18. The light emitting device of claim 13, wherein the second electrode pad contacts with an upper portion of the prevention layer.

* * * * *